United States Patent [19]
Hernandez et al.

[11] Patent Number: 5,915,462
[45] Date of Patent: Jun. 29, 1999

[54] HIGH EFFICIENCY THERMAL INTERPOSER

[75] Inventors: Bernardo Hernandez, Norwalk, Conn.; Raymond Robert Horton, Dover Plains, N.Y.; Ismail Cevdet Noyan, Peekskill, N.Y.; Michael Jon Palmer, Walden, N.Y.

[73] Assignee: International Business Machines Corporation, Armonk, N.Y.

[21] Appl. No.: 08/851,656

[22] Filed: May 6, 1997

Related U.S. Application Data

[62] Division of application No. 08/172,674, Dec. 23, 1993, Pat. No. 5,669,437, which is a continuation of application No. 07/784,135, Oct. 29, 1991, abandoned, which is a continuation of application No. 07/474,978, Feb. 5, 1990, abandoned.

[51] Int. Cl.$^6$ .................................. F28F 7/00; B23K 1/12
[52] U.S. Cl. ........................ 165/47; 165/80.3; 165/186; 219/209; 219/229; 901/49; 228/59; 228/180.22
[58] Field of Search ............................. 165/47, 170, 168, 165/169, 186, 80.3, 185; 219/229, 209; 901/49; 228/180.22, 59

[56] References Cited

U.S. PATENT DOCUMENTS

| | | |
|---|---|---|
| 2,474,615 | 6/1949 | Busquet ................................ 165/170 |
| 2,891,308 | 6/1959 | Lyons . |
| 3,161,478 | 12/1964 | Chessin . |
| 3,186,811 | 6/1965 | Waivers . |
| 3,267,997 | 8/1966 | Matarese et al. . |
| 3,327,776 | 6/1967 | Butt . |
| 3,437,965 | 4/1969 | Ragsdale . |
| 3,732,919 | 5/1973 | Wilson . |
| 3,941,297 | 3/1976 | Burns et al. . |
| 3,943,323 | 3/1976 | Smith et al. . |
| 3,946,720 | 3/1976 | Keyes et al. . |
| 4,036,188 | 7/1977 | Sami et al. . |
| 4,295,596 | 10/1981 | Doten et al. . |
| 4,300,715 | 11/1981 | Keizer et al. . |
| 4,431,474 | 2/1984 | Gronek et al. . |
| 4,531,146 | 7/1985 | Cutchaw . |
| 4,593,754 | 6/1986 | Holl . |
| 4,600,052 | 7/1986 | Wood, III et al. . |
| 4,612,978 | 9/1986 | Cutchaw . |
| 4,730,665 | 3/1988 | Cutchaw . |
| 4,937,006 | 6/1990 | Bickford et al. . |
| 5,042,708 | 8/1991 | Ledermann et al. . |
| 5,065,932 | 11/1991 | Hayden et al. . |
| 5,669,437 | 9/1997 | Hernandez et al. ..................... 165/47 |

FOREIGN PATENT DOCUMENTS

| | | |
|---|---|---|
| 3728099A1 | 1/1986 | Germany . |
| 61-29365 | 5/1987 | Japan . |
| 2196725 | 10/1987 | United Kingdom . |

OTHER PUBLICATIONS

Abstract of JA 61–293656, published May 23, 1987.

*Primary Examiner*—John K. Ford
*Attorney, Agent, or Firm*—Daniel P. Morris

[57] ABSTRACT

A high efficiency thermal interposer comprising a first hollow disk and second hollow disk, held together by thermally isolating fasteners. The fasteners keep the disks from touching one another. In an illustrative embodiment of the invention, the first disk is the low temperature disk portion and the second disk is the high temperature disk portion of the heat shield. Furthermore, according to a preferred embodiment of the invention, the space between the disks is filled with small thermally conductive particles (e.g., stainless steel spheres) which are in thermal contact with the high temperature disk; but which are not in contact with the low temperature disk. The thermal interposer/heat shield includes means for introducing cold jets of air into the cavity containing the particles, means for circulating the air therebetween, and means through which the air can exit from the cavity to carry away the heat picked up from the particles inside the cavity. The novel thermal interposer has a low mass, is compact and can achieve a temperature drop that will permit high powered HAT devices to be used in conjuction with temperature sensitive electronic orientation means, such as robot arms.

2 Claims, 5 Drawing Sheets

HIGH EFFICIENCY THERMAL INTERPOSER

RELATED APPLICATIONS

This application is a division of Ser. No. 08/172,674 filed Dec. 23, 1993, now U.S. Pat. No. 5,669,437which is a continuation of Ser. No. 07/784,135 filed Oct. 29, 1994, abandoned, which is a continuation of Ser. No. 07/474,978 filed Feb. 5,1990, abandoned.

BACKGROUND OF THE INVENTION

1. Field of the Invention

The invention generally relates to thermal isolation devices which are used as heat shields when interposed between a temperature sensitive device and a heat source. More particularly, the invention relates to a high efficiency thermal interposer (sometimes referred to hereinafter as a heat shield) for shielding a robot arm (on which high accuracy positioning devices are typically located), from the heat generated by a bonding device, such as a Hot Air Thermode (HAT). HAT devices are used for performing inner and outer lead bonding of surface mounted components to substrates through solder reflow.

2. Description of the Related Art

It is a constant endeavor in the field of heat transfer to provide means for improving the efficiency of the heat transfer process. For example, U.S. Pat. No. 3,732,919, discloses a heat exchanger having numerous solid particles such as coarse sand, gravel or spherical pelletsof concrete packed within a coolant pipe. The claimed effect of such packed particles is to give a coolant moving through the pipe a greater heat exchange surface area across which heat is then communicated from particle to particle and finally to the inner layer of the pipe. The preferred embodiments of the Wilson patent comprise long flat sheets of metal separated only by the contiguous particles. The solid particles both support the sheet metal and transfer the heat to it.

Other patents such as U.S. Pat. Nos. 3,161,478; 3,946,720; 4,593,754 and 4,600,052, also disclose heat exchangers having a pourous innerspace, e.g., spherical balls, imperforate strips, etc., which form a channel for a fluid coolant which removes the heat absorbed by the pourous innerspace. Claimed improvements in the above referenced patents are directed to providing more compact heat exchangers which are light and fit into small spaces; to providing structures through which coolants may be dispersed in an improved manner, etc.

These improved heat exchangers are commonly used to cool, for example, individual electronic components, integrated circuit packages, etc. as typified by the disclosures set forth in U.S. Pat. Nos. 3,327,776; 4,531,146; 4,612,978 and 4,730,665.

A variety of heat exchange techniques have been employed in conjunction with bonding tools typically used in the manufacture and/or repair of semiconductor electronic devices. In U.S. Pat. No. 4,295,596 apparatus and methods are described for bonding an article to a metallized substrate, at least one of which has a predeposited reflowable bonding material (e.g., solder) thereon. The described method comprises the steps of positioning the article on the substrate; directing at least one stream of hot gas towards the substrate; redirecting the gas stream laterally, towards the article, to reflow the material; and resolidifying the material to form a bond between the article and the substrate.

The bonding tool described in the U.S. Pat. No. 4,295,596 patent is fixedly mounted to a support which is mounted for vertical movement. The tool includes a nozzle which is positioned, over the article and substrate, via push rods that are used to overcome a spring force in the body portion of the tool. A plurality of cooling fins on the tool itself removes the tool generated heat.

Another type of bonding tool using different heat exchange methodology is disclosed in U.S. Pat. No. 4,300,715. This tool is described in the context of an assembly system for assembling elements of microcomponent devices like integrated circuits and other electronic devices. The disclosed system operates at temperatures in the approximately 400 degrees C. range, and uses a pneumatically controlled bonding tool to move a thermode into and out of contact with the elements to be bonded. In this system, a substrate support table accurately positions the substrate under the bonding tool.

The system taught in the U.S. Pat. No. 4,300,715 patent uses the substrates as heat sinks when the substrates themselves are not being heated by the tool. The heating tool includes a heating anvil, the tips of which are air cooled.

Neither the U.S. Pat. No. 4,295,596 nor the 4,300,715 patent are concerned with the cooling or shielding of the positioning means used in conjunction with the substrates and/or bonding tools taught in these references.

Hot air thermodes (HAT), such as the device taught in U.S. Pat. No. 4,937,006 (hereby incorporated by reference) provide a low load, fluxless and low cost method of inner and outer lead bonding of surface mount components through solder reflow. These state of the art thermode devices have high power outputs and thus generate a lot more heat in the heat exchanger then is used to heat the reflow gas. Since, because of efficiency and temperature requirements, this heat exchanger is closely positioned to the bonding nozzle, the whole assembly must be mounted on high-accuracy positioners at the end of a robot arm. The stray heat that escapes through the mounting shaft and/or brackets into the positioners causes temperature increase in the robot assembly itself, impacting accurate alignment and operation.

To prevent such temperature increase in the robot arm, a suitable heat shield must be interposed between the robot arm and the HAT device. Such a heat shield must be compact to fit in the limited space available for most pick place attach (PPA) tools, have low mass to limit the inertia of the robot arm assembly and cannot use liquids as a cooling medium to eliminate possible coolant contamination of the components being assembled.

The desired heat shield must be able to withstand the heat generated by state of the art high powered HAT devices. These devices operate at approximatly 700 degrees C. with power levels from 600 to 1500 watts. Also, the heat shield must be effective under circumstances where the bonding nozzle of the HAT device may be located less than 1 inch from the robot arm assembly. The robot arm assembly typically cannot be exposed to more than approximately 100 degrees C. without severely affecting sensitive components located in the assembly. The normal operating temperature for robot arm assemblies of the type contemplated herein is approximately 40 degrees C.

Accordingly, it would be desirable to provide a high efficiently, low mass thermal interposer that can drop temperatures on the order of 700 degrees C. to temperatures on the order of 40 degrees C., over less than approximately one inch.

Furthermore, it would be desirable if such an interposer could be cooled without using liquids to thereby eliminate the possiblity of coolant contamination of the components being assembled.

Still further, it would be desirable if an interposer possessing the above stated characteristics were available for use in conjunction with high powered HAT devices, to enable such devices to be directly attached to heat sensitive PPA assemblies (such as robots) in a safe, reliable and efficient manner.

SUMMARY OF THE INVENTION

It is a general object of the invention to provide a thermal interposer which can be used in conjunction with high powered HAT devices, to enable such devices to be directly attached to heat sensitive PPA assemblies.

It is a specific object of the invention to provide a high efficiency thermal interposer capable of dropping temperatures on the order of 700 degrees C. to temperatures on the order of 40 degrees C., over less than approximately one inch.

It is a further specific object of the invention to provide a thermal interposer which is compact and can be used in the limited space available for most PPA tools.

It is still another specific object of the invention to provide a low mass thermal interposer for use in conjunction with robot arm assemblies to limit the inertia on such assemblies.

It is yet another specific object of the invention to provide a thermal interposer that can be cooled without the use of liquids to thereby eliminate the possibility of coolant contamination of the components being assembled.

According to the invention, the desired thermal interposer is comprised of first (e.g., low temperature) and second (e.g., high temperature) hollow disks held together by thermally isolating fasteners. The fasteners keep the disks from touching one another. A preferred embodiment of the invention calls for the space between the disks to be filled with small thermally conductive particles (e.g., stainless steel spheres) which are in thermal contact with the high temperature disk; but which are not in contact with the low temperature disk.

Furthermore, according to a preferred embodiment of the invention, the thermal interposer/heat shield includes means for introducing cold jets of air into the cavity containing the particles, means for circulating the air therebetween, and means through which the air can exit from the cavity to carry away the heat picked up from the particles inside the cavity.

The invention features a heat shield that has a low mass and can be made compactly. Furthermore, the invention features a heat shield that can achieve a temperature drop that will permit high powered HAT devices to be used in conjuction with temperature sensitive electronic orientation means, such as robot arms.

These and other objects and features of the present invention and the manner of obtaining them will become apparent to those skilled in the art, and the invention itself will be best understood by reference to the following detailed description read in conjunction with the accompanying Drawing.

DETAILED DESCRIPTION

Figure 1:
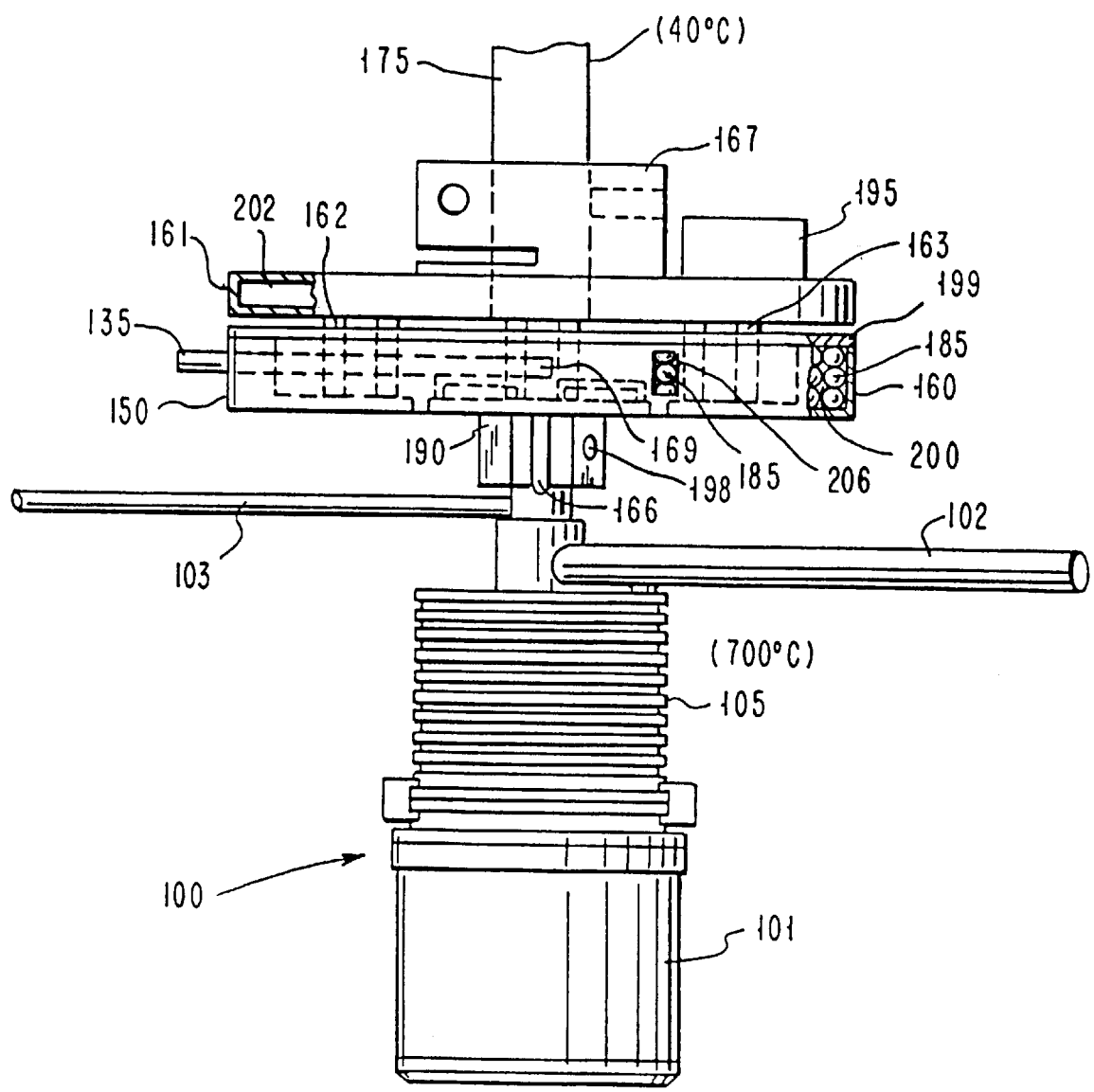
FIG. 1 depicts a scale drawing of the thermal interposer (heat shield) contemplated by the invention, shown disposed between, and thermally isolating, a HAT device and a positioning robot arm.
Figure 2:
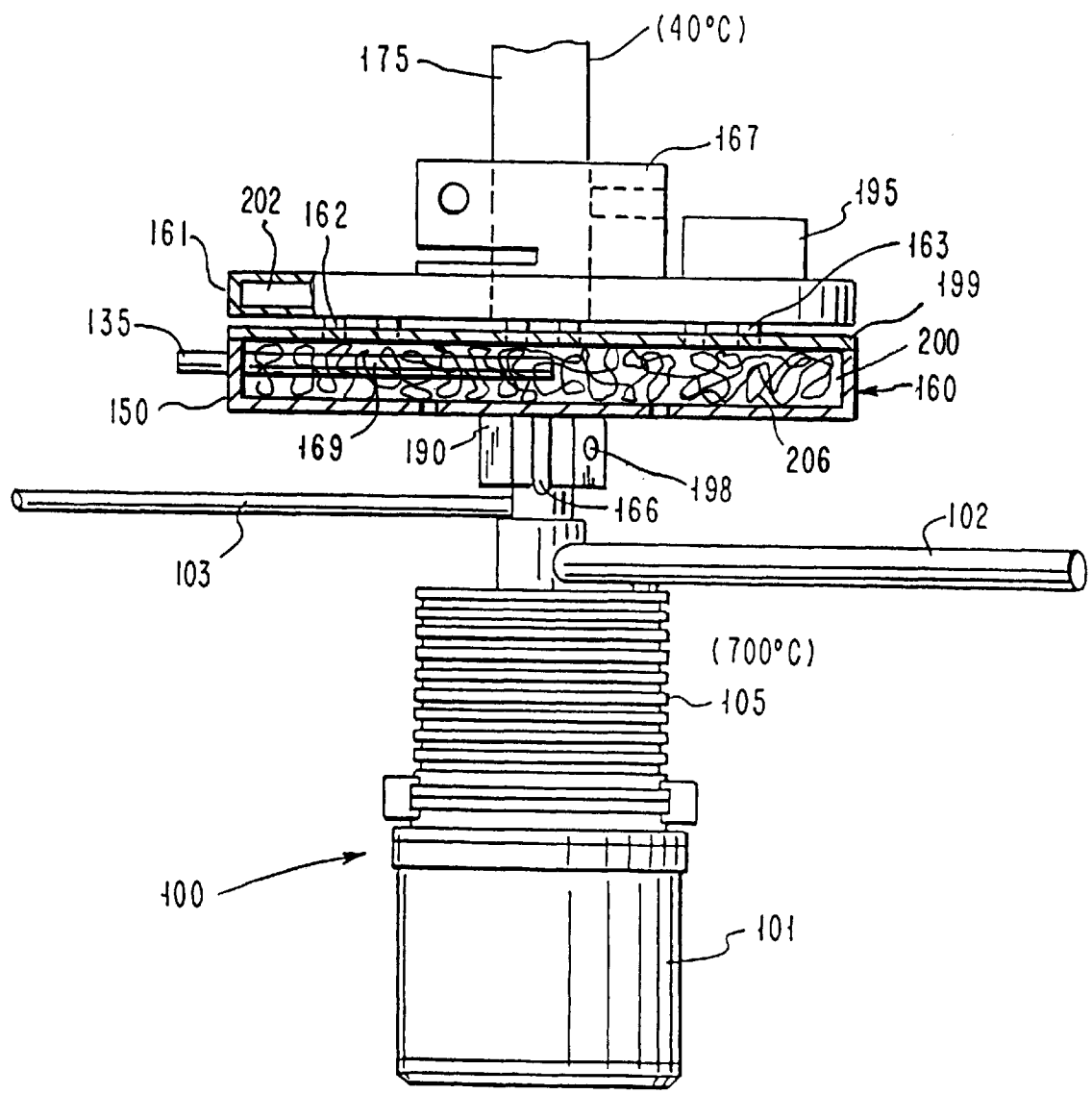
FIG. 2 shows the apparatus of FIG. 1 with hollow space 200 of member 160 visible and containing steel wool 206.
Figure 3:
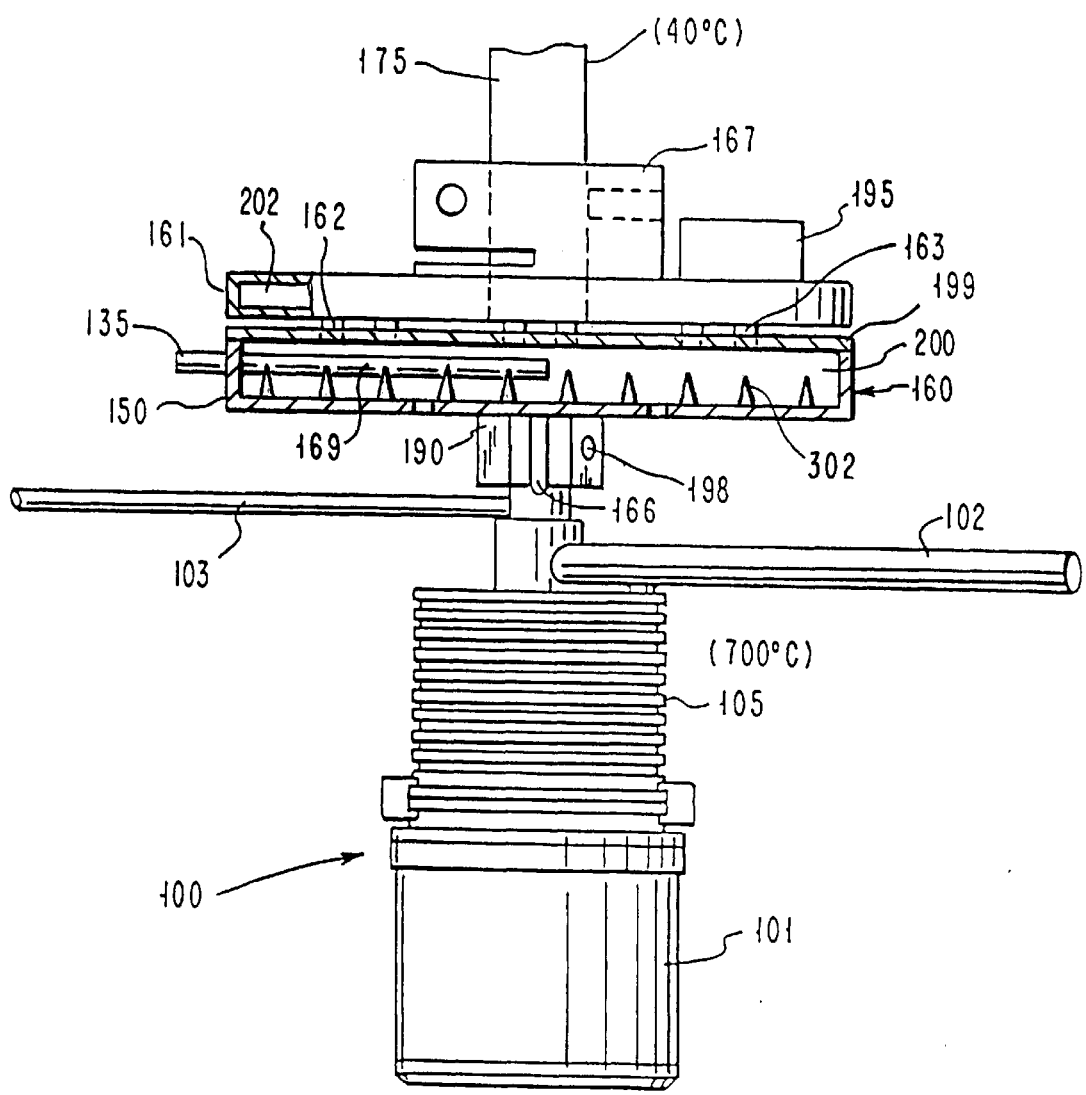
FIG. 3 shows the apparatus of FIG. 1 with hollow space 200 of member 160 visible and containing pins 302.
Figure 4:
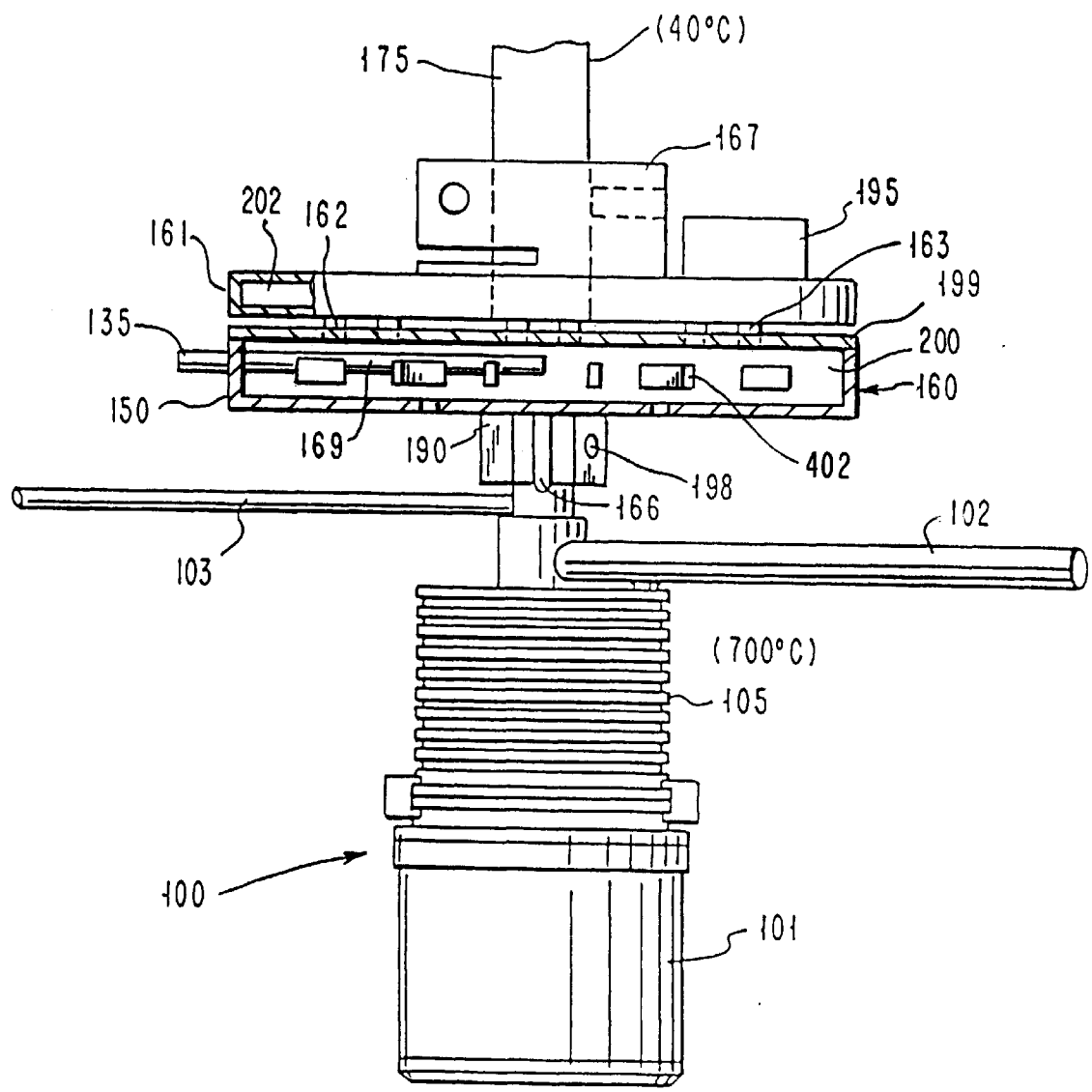
FIG. 4 shows the apparatus of FIG. 1 with hollow space 200 of member 160 visible and containing fins 302.
Figure 5:
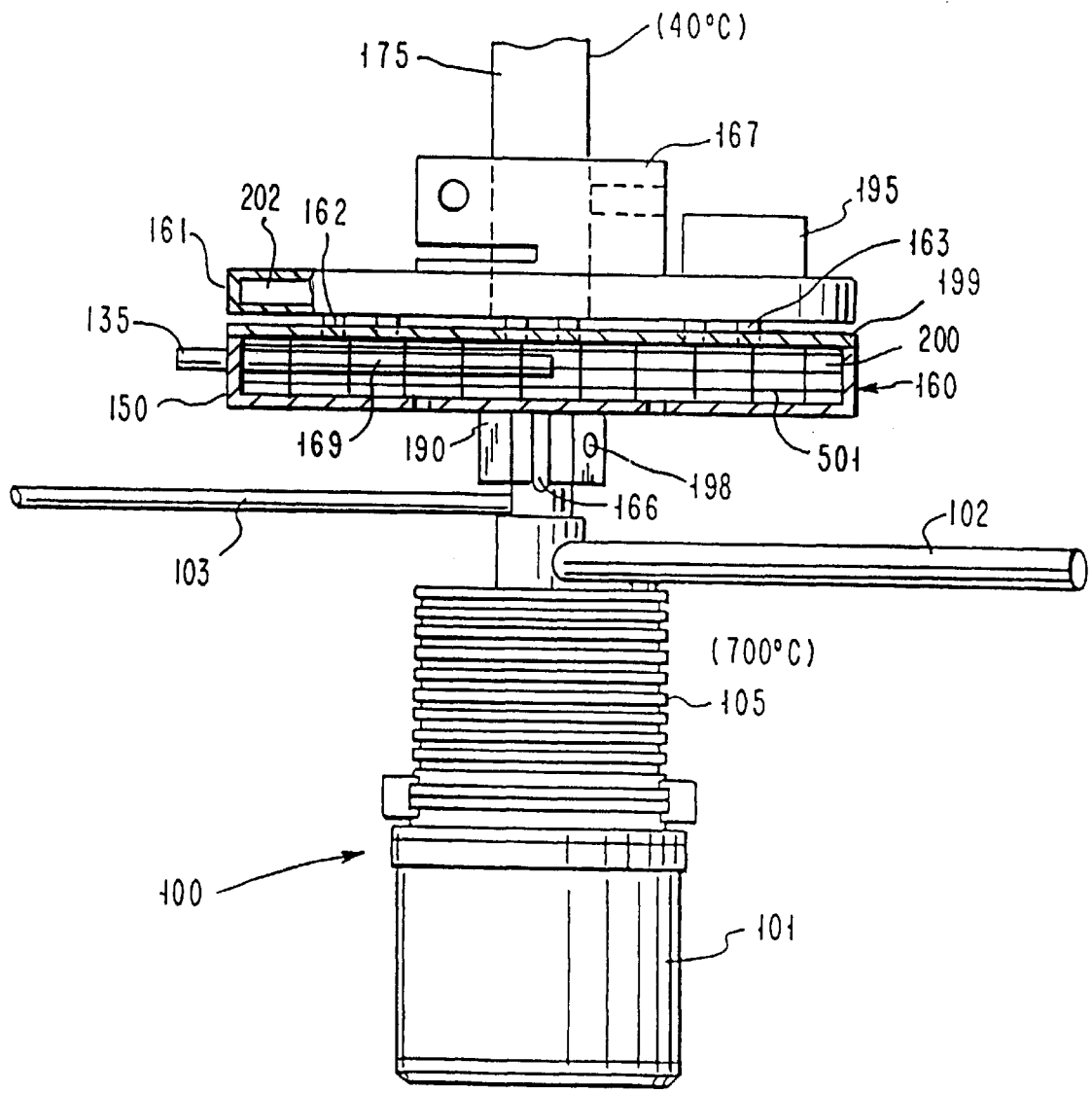
FIG. 5 shows the apparatus of FIG. 1 with the hollow space 202 of member 160 visible and containing intermeshing wires 501.

The lower portion of FIG. 1 depicts HAT device 100, comprised of HAT/nozzle assembly 101, gas/vacuum cooling pipe 102 and pick/place vacuum pipe 103. As indicated hereinbefore, the depicted HAT device is typified by the device described in the patent application previously incorporated herein by reference.

Gas/vacuum cooling pipe 102 is used to channel gas for solder reflow to a part held by nozzle 101, and is used to provide a vacuum to cool the soldered area as taught in the referenced patent application. Pick/place vacuum pipe 103 is used to hold in place within nozzle 101, the part being worked upon by HAT device 100.

According to the teachings of the incorporated reference, heat is generated in a heater body assembly, labeled 105 in FIG. 1. Part of this heat is removed into HAT/nozzle assembly 101 by the bonding gas which enters through pipe 102. This heat travels down through assembly 101 and may be used to reflow solder. However, not all the heat is removed by the bonding gas; a portion will flow through depicted coupling 166 and heat whatever is attached to crevice 100. Temperatures at location 105 can reach approximately 700 degrees C.

Although the invention is well suited to working in conjunction with HAT device 100, a HAT device is depicted in FIG. 1 only for the sake of illustrating the principles of the invention. The thermal isolating device to be described hereinafter could be used as a heat shield for other heat sources.

Also depicted in FIG. 1 is the novel heat shield itself, heat shield 150, shown disposed between HAT device 100 and robot arm 175. HAT device 100 is shown coupled to the body of the heat shield via, for example, screw chuck 190 which is shown to include a cavity for receiving HAT device 100 and a set screw, 198 for holding HAT device 100 in place.

Heat shield 150 is shown comprised of two hollow disks 160 and 161, that are held together with thermal isolating fasteners (or spacers) such as spacer 162 and 163. According to a preferred embodiment of the invention, four thermal spacers are used to insure that there is no contact between disks 160 and 161, except through the spacers. The number of spacers utilized is not meant to in any way to limit the scope of the invention.

Couplings, shown as couplings 166 and 167 in FIG. 1, are shown incorporated into disks 160 and 161 respectively, to fit HAT device 100 and robot arm 175.

The hollow region between disks 160 and 161 is, according to the preferred embodiment of the invention, filled with stainless steel spheres 185. Alternative embodiments of the invention may employ other heat exchange means including other forms of heat conducting particles, thermally conductive fins 402, pins 802, intermeshing wires 501, steel wool 206, etc. Furthermore, according to the preferred embodiment of the invention, air dispenser 169 is incorporated within heat shield 150 to allow the introduction of jets of cold air (via cool air pipe 135) between the spheres. Still further, the preferred embodiment of the invention calls for slits (not shown) to be machined on the sides of disk 160 to serve as air exhaust ducts.

During operation, the stray heat from HAT device 100 heats up bottom disk 160 and the heat is transferred to spheres 185. The spheres then transfer the heat to the cooling gas (e.g., the cold air utilized in the preferred embodiment of the invention).

Since spheres 185 are not allowed to come in contact with disk 161, heat conduction to disk 161 only occurs via the thermally insulating spacers (e.g., spacers 162, 163, etc.). Very low cooling gas flow in the range of 5 SCFH, is sufficient to keep the temperature difference between disk 160 and 161 to around 650 degrees C. In actual tests, the temperature of robot arm 175 next to heat shield 150 was 40 degrees C. when HAT device 100 was operated at a maximum permissable body temperature of 700 degrees C. This temperature (40 degrees C.) is well within the 100 degrees C. tolerance of typical robot arms.

Also shown in FIG. 1, is a preferred embodiment of the invention wherein disk 161 (the low temperature disk) is fabricated to include means 195 for holding wires which provide electrical power to HAT device 100.

Additionally, FIG. 1 depicts shield retainer 199 which, in a preferred embodiment of the invention, is a diaphragm that retains spheres 185 within the cavity formed between disks 160 and 161, and protects disk 161 from the heat being dissipated within the cavity. A suitable diaphragm may be fabricated from stainless steel.

The thermal interposer described hereinabove does not have any special requirements other than a very low volume of cool (room temperature) air. No extensive piping is required. The interposer is inexpensive to manufacture, easy to use, and does not give off heat waves which could interfere with the vision system on the robot, and thermally separates HAT device 100 from robot arm 175.

As indicated hereinbefore, the entire interposer can be fabricated within a compact 1 inch high space, and has a low mass, weighing under 1 pound.

Accordingly, thermal interposer/heat shield 150 meets all of the objectives of the invention set forth hereinbefore.

What has been described are methods, apparatus and manufacturing processes meeting all of the objectives set forth hereinbefore. Those skilled in the art will recognize that the foregoing description has been presented for the purposes of illustration and description only. It is not intended to be exhaustive or to limit the invention to the precise form disclosed, and obviously many modifications and variations are possible in light of the above teaching.

The embodiments and examples set forth herein were presented in order to best explain the principles of the instant invention and its practical application to thereby enable other skilled in the art to best utilize the instant invention in various embodiments and with various modifications as are suited to the particular use contemplated.

What is claimed is:

1. A thermal isolation device comprising:

first and second thermally conductive members respectively placed in thermal communication with a heat source and an object being isolated from said heat source;

means for fastening said first and second members together and spacing said members apart wherein means for fastening and spacing thermally insolates said first and second members from each other;

said first member having a cavity;

a heat exchange means, contained within said cavity, placed in thermal contact with said first member, but not with said second member;

means for introducing a cooling fluid into said cavity and circulating said fluid between said heat exchange means;

means for substantially preventing said fluid from contacting said second member;

said means for substantially preventing said fluid from contacting said second member being spaced apart from said second member providing a space there between;

means for removing fluid that has circulated between said heat exchange means to effectively dissipate the heat communicated to the heat exchange means from said heat source;

said heat exchange means comprises intermeshing wires.

2. A method for providing thermal isolating between an object and a heat source, comprising the steps of:

placing first and second thermally conductive members in thermal communication with a heat source and an object being isolated from said heat source;

fastening said first and second members together utilizing thermally insulating means;

said first member having a cavity;

locating a heat exchange means within said cavity in thermal contact with said first member, but not with said second member;

introducing a cooling fluid into said cavity and circulating said fluid between said heat exchange means;

substantially preventing said fluid from contacting said second member;

removing fluid that has circulated between said heat exchange means to effectively dissipate the heat communicated to the heat exchange means for said heat source; and said heat exchange means comprises intermeshing wires.

* * * * *